(12) United States Patent
Do

(10) Patent No.: US 8,488,380 B2
(45) Date of Patent: Jul. 16, 2013

(54) WORD LINE DRIVING CIRCUIT, SEMICONDUCTOR MEMORY DEVICE INCLUDING THE SAME, AND METHOD FOR TESTING THE SEMICONDUCTOR MEMORY DEVICE

(75) Inventor: Chang-Ho Do, Kyoungki-do (KR)

(73) Assignee: Hynix Semiconductors Inc., Gyeonggi-do (KR)

( * ) Notice: Subject to any disclaimer, the term of this patent is extended or adjusted under 35 U.S.C. 154(b) by 0 days.

(21) Appl. No.: 13/274,722

(22) Filed: Oct. 17, 2011

(65) Prior Publication Data

US 2012/0033516 A1    Feb. 9, 2012

Related U.S. Application Data

(63) Continuation of application No. 12/003,546, filed on Dec. 28, 2007, now Pat. No. 8,045,394.

(30) Foreign Application Priority Data

Jun. 8, 2007 (KR) .............................. 2007-0055964

(51) Int. Cl.
*G11C 11/34* (2006.01)

(52) U.S. Cl.
USPC ............ 365/185.11; 365/185.23; 365/188.18; 365/230.06

(58) Field of Classification Search
USPC .............. 365/185.11, 185.23, 185.18, 230.06
See application file for complete search history.

(56) References Cited

U.S. PATENT DOCUMENTS 5,801,991 A * 9/1998 Keeney et al. ........... 365/185.23

FOREIGN PATENT DOCUMENTS

| JP | 05-013528 | 1/1993 |
| JP | 09-091993 | 4/1997 |
| JP | 10-247398 | 9/1998 |
| JP | 11-144497 | 5/1999 |

OTHER PUBLICATIONS

Preliminary Rejection issued by the Japan Patent Office on Sep. 4, 2012.

* cited by examiner

*Primary Examiner* — Jason Lappas
(74) *Attorney, Agent, or Firm* — IP & T Group LLP

(57) ABSTRACT

A semiconductor memory device in accordance with the present invention is able to facilitate detecting whether a word line fails or not by floating the word line. The semiconductor memory device includes a word line driver, and a floating controller. The word line driver is configured to control a word line to be enabled/disabled. The floating controller is configured to control the word line driver to float the word line in response to a word line floating signal.

7 Claims, 9 Drawing Sheets

WORD LINE DRIVING CIRCUIT, SEMICONDUCTOR MEMORY DEVICE INCLUDING THE SAME, AND METHOD FOR TESTING THE SEMICONDUCTOR MEMORY DEVICE

CROSS-REFERENCE TO RELATED APPLICATIONS

This application is a continuation of U.S. patent application Ser. No. 12/003,546 filed on Dec. 28, 2007, now U.S. Pat. No. 8,045,394 which claims priority of Korean patent application number 10-2007-0055964 filed on Jun. 8, 2007. The disclosure of each of the foregoing applications is incorporated herein by reference in its entirety.

BACKGROUND OF THE INVENTION

The present invention relates to a word line driving circuit, a semiconductor memory device including the same, and a method for testing the semiconductor memory device, and more particularly to an apparatus and a method adapted to facilitate detecting whether a word line fails or not in a semiconductor memory device.

As it is well known, a word line controls a gate of a memory cell in a semiconductor memory device. A conventional word line driving circuit will be described below.

FIG. 1 illustrates a schematic circuit diagram of a conventional word line driving circuit.

Specifically, FIG. 1 illustrates a word line driving circuit for controlling a word line provided with a main word line and a sub word line. Currently, the word line has a hierarchical structure of a main word line MWL and a sub word line SWL, in which the sub word line SWL controls a gate of a memory cell.

As shown in FIG. 1, the conventional word line driving circuit includes a phi X driver 110 and a sub word line driver 120. The phi X driver 110 outputs a phi X control signal PX_J having address information. The sub word line driver 120 drive a sub word line in response to a main word line signal MWLB_I and the phi X control signal PX_J.

Here, a signal PXB_J, which is generated by decoding row address information, selects a sub word line. The signal MWLB_I refers to a main word line signal. In addition, the signal SWL_K, which is a resultant output of the word line driving circuit, refers to a signal for driving a word line. In this driving scheme, the signal SWL_K refers to a signal for driving the sub word line because the sub word line directly controls a memory cell.

As for the operation of the conventional word line driving circuit, the signals MWLB and PXB are at logic high levels in a state that a word line is not activated, i.e., in a precharge mode. At this time, transistors MP0 and MP1 are turned off and transistors MN0, MN1 and MN2 are is turned on, whereby the word line SWL maintains its logic low state.

When an active command is applied from the outside, the signals MWLB and PXB go to logic low levels after a predetermined time in synchronization with an inputted address. The phi X control signal PX goes to a logic high level because it is an inverted signal of the signal PXB. At this state, the transistors MP0 and MP1 are turned on but the transistors MN0, MN1 and MN2 are turned off, thus enabling the word line SWL to a logic high state.

Though FIG. 1 is a simple circuit diagram illustrating the operation of the conventional word line driving circuit, an actual memory device has a more complicated structure for driving a word line. However, this complicated actual structure is not necessary in describing the background of the present invention so that further description for it will be omitted herein.

FIG. 2 is a block diagram illustrating the arrangement of the word line driving circuit of FIG. 1 in a cell array of a conventional memory device.

FIG. 2 illustrates a main word line MWLB, a plurality of sub word lines SWL branched from the main word line MWL, sub word line drivers SWD for driving the sub word lines SWL, and connections of a plurality of the phi X control signal PXB thereamong. This configuration is a typical one and it can be easily appreciated by a person of ordinary skill in the art, so that further detailed description will be omitted herein.

FIG. 3 is a circuit diagram illustrating how sub word lines are allocated to a main word line in a conventional semiconductor memory device. Referring to FIG. 3, sub word lines SWL0, SWL2, SWL4 and SWL6 are allocated to a main word line MWLB0, and sub word line drivers are also allocated to the sub word lines.

With the increasing demands for high capacity semiconductor memory devices, semiconductor devices have shrunk in size so as to highly integrate more and more memory cells within a small chip area. As the semiconductor devices shrink in size, a bridge fail between interconnections frequently may occur in a highly dense area of a core region of a memory cell.

If the bridge between the interconnections serves as a low-resistance resistor, i.e., in a weak fail, there is no problem in a normal operation but may cause the memory device to be deteriorated with the elapse of a predetermined use time or after a device has undergone a burn-in test. In particular, there may be a number of weak bridge fails between adjacent lines such as word lines which are used as an interconnection as well as gate material for a memory cell.

However, the conventional memory device does not have an apparatus or a device adapted to detect the bridge fail of the word line yet.

SUMMARY OF THE INVENTION

Embodiments of the present invention are directed to providing a word line driving circuit adapted to facilitate detecting whether a word line fails or not, a semiconductor memory device including the same, and a method for testing the semiconductor memory device.

A common feature of a word line driving circuit, a memory device having the same and a testing method in accordance with the present invention is to facilitate detecting whether a word line fails or not by floating the word line.

In one embodiment, a semiconductor memory device includes a word line driver configured to control a word line to be enabled/disabled, and a floating controller configured to control the word line driver to float the word line in response to a word line floating signal.

In another embodiment, a word line driving circuit includes a word line driver configured to drive a word line by supplying a high voltage or a low voltage to the word line, and a floating controller configured to control the word line driver to prevent the high voltage or the low voltage from being supplied to the word line in response to a word line floating signal.

In a further embodiment, a method for testing a semiconductor memory device includes floating a word line in response to a word line floating signal, writing data to the floated word line, and reading the data of the word line.

In still another embodiment, a semiconductor memory device includes a word line floating signal generator configured to generate a word line floating signal for floating a word line, and a word line configured to be floated in response to the word line floating signal.

DESCRIPTION OF SPECIFIC EMBODIMENTS

Hereinafter, a word line driving circuit, a semiconductor memory device including the same, and a method for testing the semiconductor memory device in accordance with the present invention will be described in detail with reference to the accompanying drawings.

Figure 4:
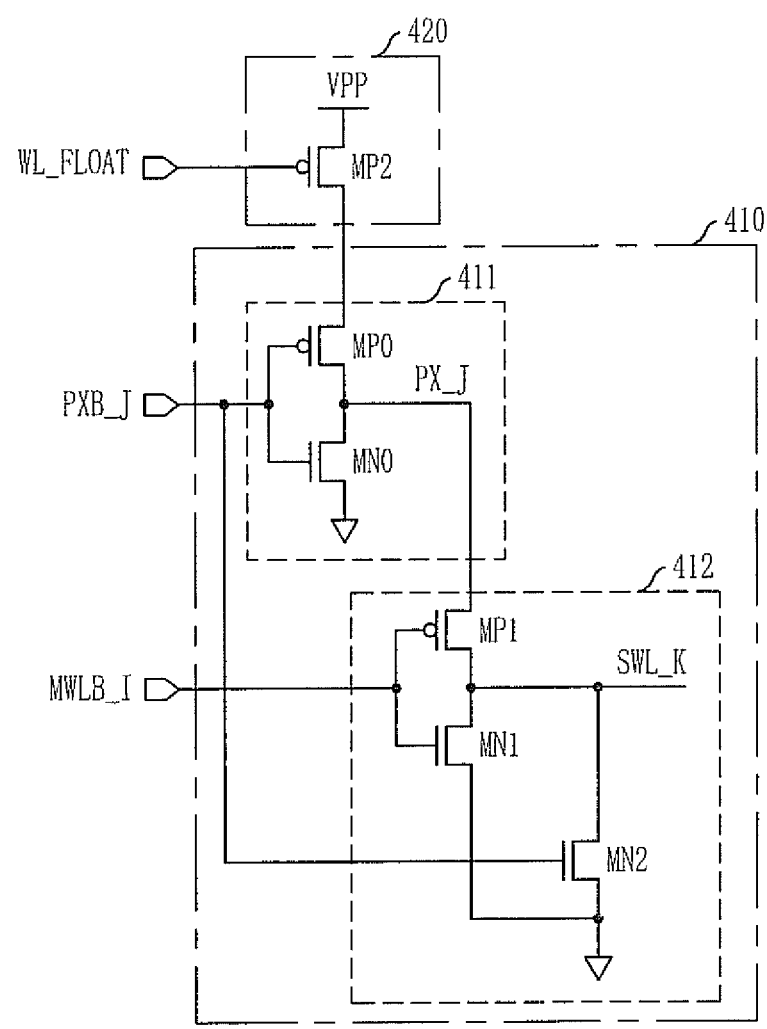
FIG. 4 illustrates a schematic circuit diagram of a word line driving circuit of a semiconductor memory device in accordance with an embodiment of the present invention.

FIG. 4 illustrates a schematic circuit diagram of a word line driving circuit of a semiconductor memory device in accordance with an embodiment of the present invention.

The word line driving circuit in accordance with the embodiment of the present invention includes a word line driver 410 and a floating controller 420. The word line driver 410 controls a word line to be enabled or disabled. The floating controller 420 controls the word line driver 410 to float the word line in response to a word line floating signal WL_FLOAT.

While the conventional word line driving circuit does not include a unit for floating the word line, the word line driving circuit in accordance with the embodiment of the present invention includes the floating controller 420 configured to float the word line.

When the word line floating signal WL_FLOAT is activated, the floating controller 420 floats the word line regardless of which signal is applied to the word line driver 410. In detail, the floating controller 420 prevents charges from flowing to the word line when the word line floating signal WL_FLOAT is activated. That is, the floating controller 420 prevents a power supply in response to the word line floating signal WL_FLOAT.

In the embodiment, the floating controller 420 prevents the charges from flowing to the word line when the word line floating signal WL_FLOAT is activated, which can be achieved by preventing the supply of a power voltage VPP to the word line driver 410, as illustrated in FIG. 4. To this end, the floating controller 420 may include a PMOS transistor MP2 configured to receive the word line floating signal WL_FLOAT through a gate thereof, and having a drain-source path through which a pull-up voltage VPP is supplied.

Figure 1:
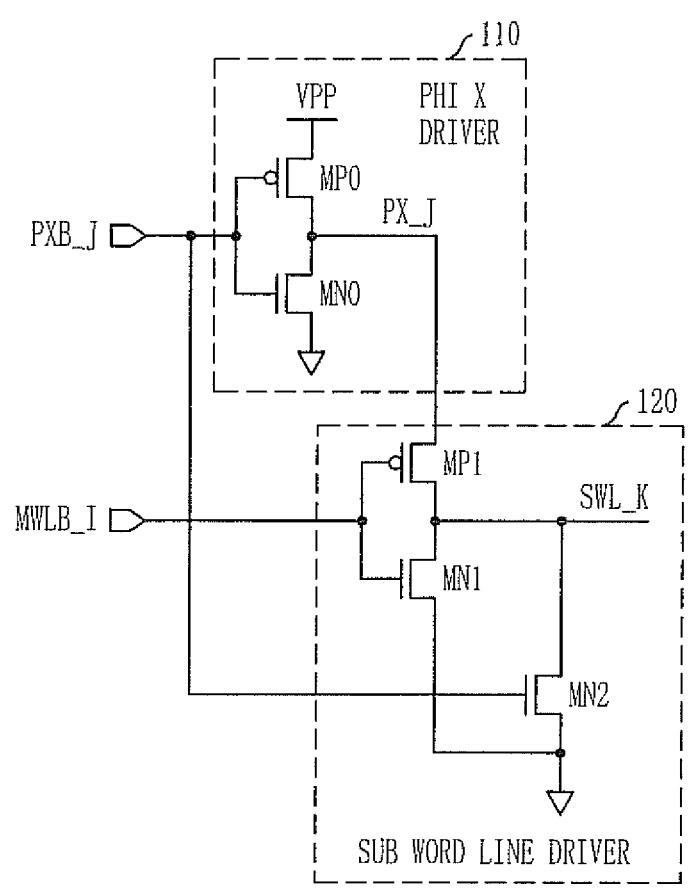
FIG. 1 illustrates a schematic circuit diagram of a conventional word line driving circuit.
Figure 2:
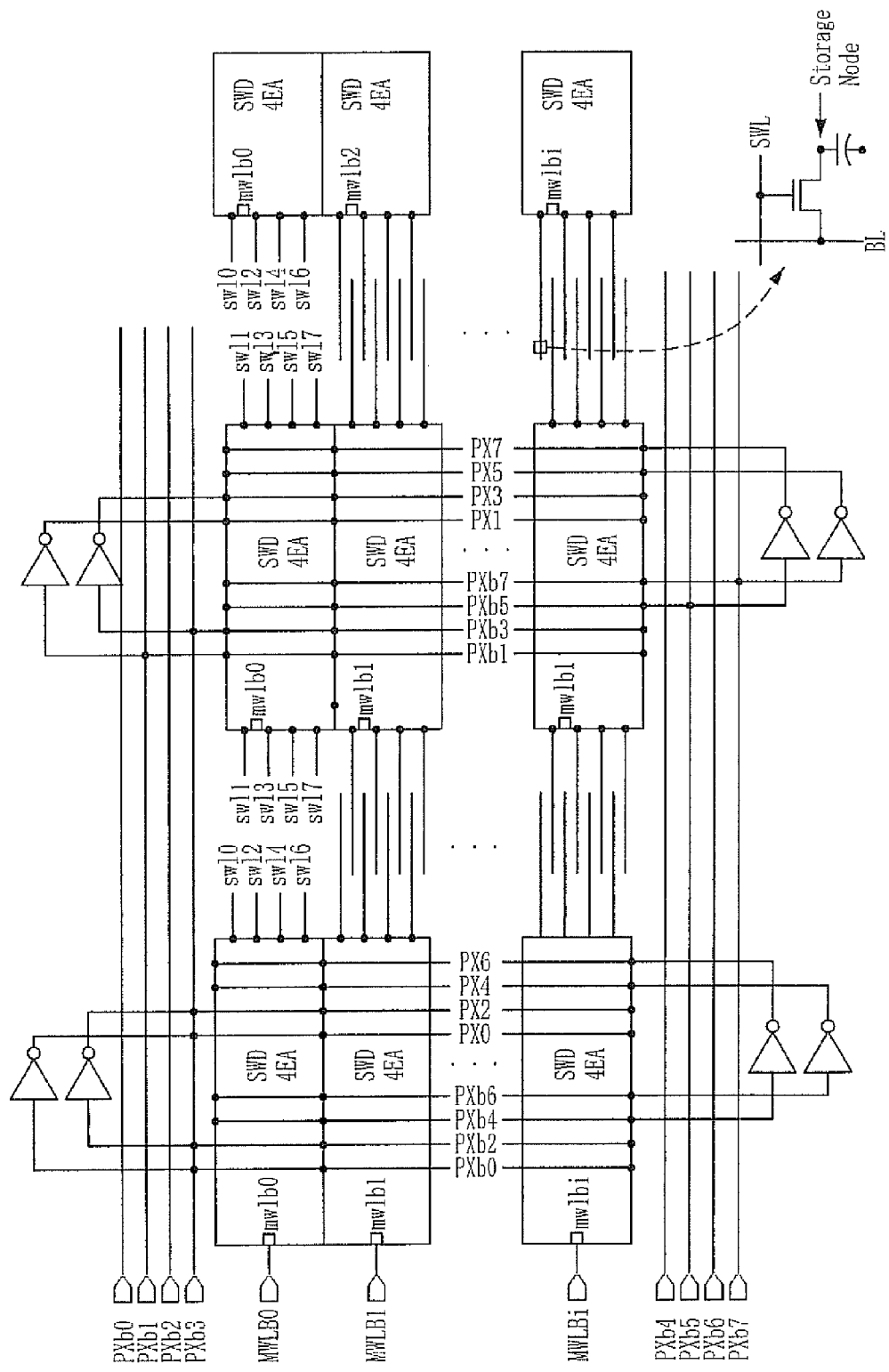
FIG. 2 is a block diagram illustrating the arrangement of the word line driving circuit of FIG. 1 in a cell array of a conventional memory device.
Figure 3:
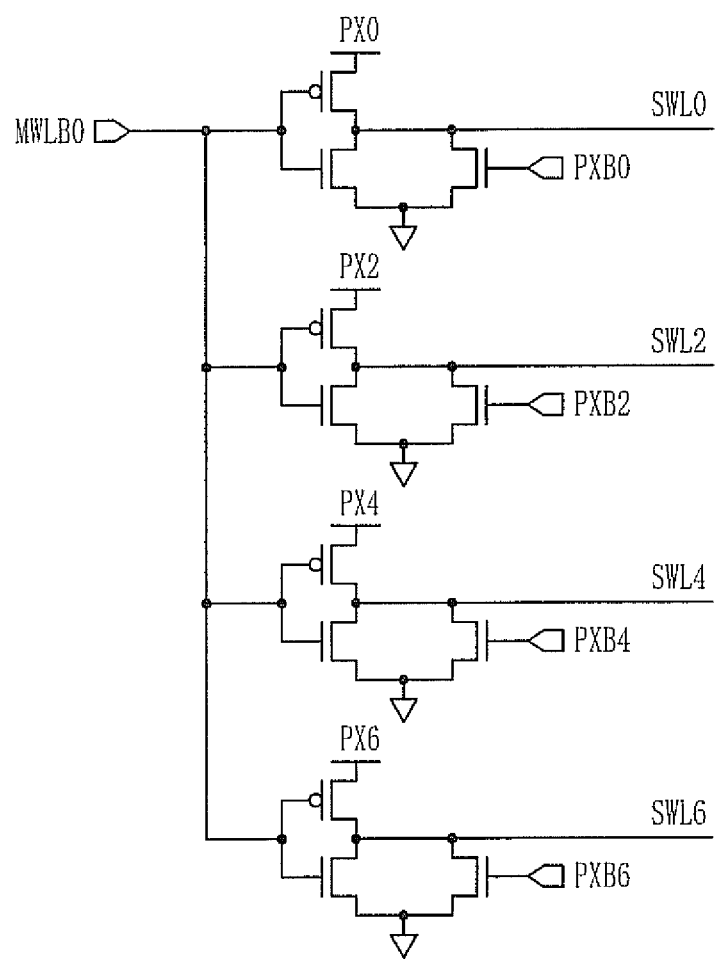
FIG. 3 is a schematic circuit diagram illustrating how sub word lines are allocated to a main word line in a conventional semiconductor memory device.

The word line driver 410 for driving a sub word line SWL is similar to the conventional word line driver (see FIG. 1). That is, the word line driver 410 may include a phi X driver 411 configured to output a phi X control signal PX_J having address information; and a sub word line driver 412 configured to drive the sub word line SWL in response to a main word line signal MWLB_I and the phi X control signal PX_J.

Although FIG. 4 exemplarily illustrates the word line driver 410 for driving the word line that has a hierarchical structure of a main word line MWLB and the sub word line SWL, the word line driver 410 can be modified into alternative structures depending on a word line scheme applicable to a memory device. For example, FIG. 4 illustrates that the word line driver 410 floats the sub word line SWL in response to the word line floating signal WL_FLOAT. However, the word line or the main word line can float depending on the word line scheme. That is, since the essential point of the present invention is to provide a word line driving circuit capable of floating the word line in response to the word line floating signal WL_FLOAT, the present invention can be applied a case that the word line is driven in other fashions.

In the exemplary embodiment, the word line floating signal WL_FLOAT is used for floating the word line when it is activated. Specifically, the word line floating signal WL_FLOAT may be controlled such that it is activated after the lapse of a predetermined time from the generation of an active command in a test mode and deactivated by a precharge command. A circuit adapted to generate the word line floating signal WL_FLOAT will be more fully described later with reference to FIGS. 5A and 5B.

As for an operation of the word line driving circuit of FIG. 4, when the word line floating signal WL_FLOAT is activated to a logic high level even though the transistors MP0 and MP1 are tuned on in an active mode, the transistor MP2 receives the activated word line floating signal WL_FLOAT so that the transistor MP2 supplying the pull-up voltage VPP turns off. Therefore, the pull-up voltage VPP is not supplied to the word line driver 410. The word line SWL floats at a high impedance state.

Figure 5A:
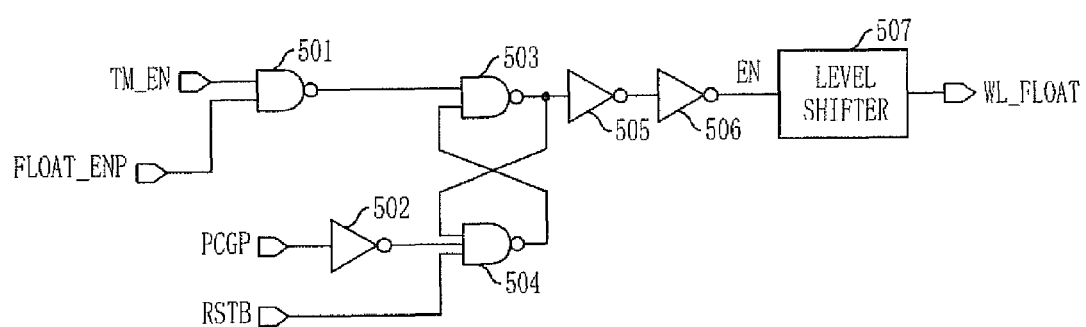
FIG. 5A illustrates a block diagram of a floating signal generator configured to generate a word line floating signal which is an input signal of the word line driving circuit described in FIG. 4.

FIG. 5A illustrates a block diagram of a floating signal generator configured to generate the word line floating signal WL_FLOAT.

As described above, the word line floating signal WL_FLOAT may be controlled such that it is activated after the lapse of a predetermined time from the generation of the active command in the test mode and deactivated by the precharge command. Since the reason of floating the word line is to test whether the word line fails or not, the word line floating signal WL_FLOAT is controlled such that it is activated in the test mode.

In more detail, the word line floating signal WL_FLOAT is activated in response to a floating enable pulse FLOAT_ENP that is activated after the lapse of a predetermined time from the generation of the active command in the test mode. The word line floating signal WL_FLOAT is deactivated in response to a precharge pulse PCGP that is activated in a precharge mode. The floating signal generator may include a set-reset (SR) latch 503 and 504 configured to receive the floating enable pulse FLOAT_ENP and the precharge pulse PCGP to output a word line floating signal EN (this is a word line floating signal before it passes through a level shifter).

In addition, the floating signal generator may further include a level shifter 507. The level shifter 507 is provided for adjusting the voltage level of the word line floating signal WL_FLOAT to a high voltage level because the pull-up voltage used in the word line driving circuit generally has a voltage level corresponding to that of a boosted voltage VPP.

For reference, a reset signal RSTB, which is inputted to a NAND gate 504, initializes the word line floating signal WL_FLOAT to a logic low level in initialization of a memory device.

Figure 5B:
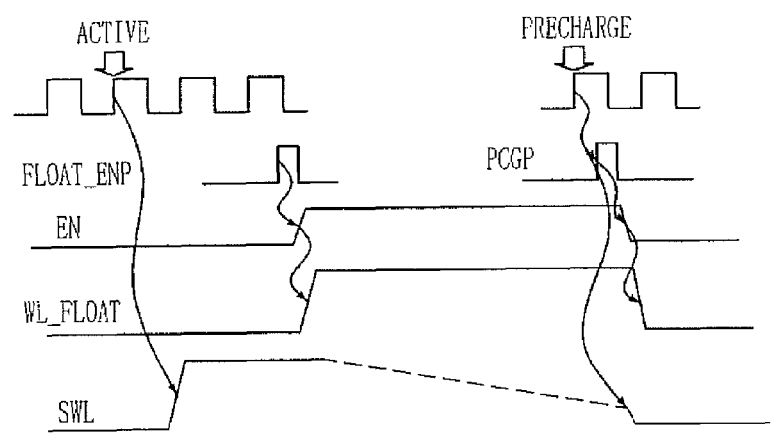
FIG. 5B is a timing diagram illustrating an operation of the floating signal generator described in FIG. 5A.

An operation of the floating signal generator will be described with reference to FIG. 5B below. When an active command is applied in a state that a test mode enable signal TM_EN is activated in the test mode, the word line SWL is enabled. Then, when the floating enable pulse FLOAT_ENP is generated for floating the word line SWL, the word line floating signal WL_FLOAT is activated in response to the floating enable pulse FLOAT_ENP, thus turning off the transistor MP2 of FIG. 4 to float the word line SWL. Thereafter, if the precharge command is applied from the outside, the word line SWL is disabled in synchronization with the precharge command. The word line floating signal WL_FLOAT is disabled in response to a precharge pulse PCGP that is generated in the precharge mode, and hence the word line SWL does not float any longer.

Figure 6A:
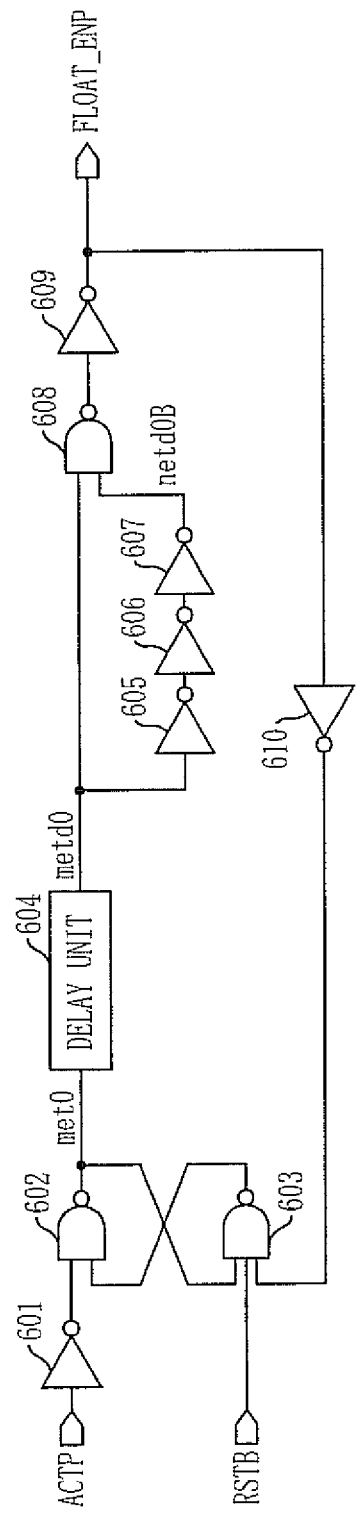
FIG. 6A is a block diagram illustrating an embodiment of a pulse generator configured to generate a floating enable pulse which is an input signal of the floating signal generator described in FIG. 5A.

FIG. 6A is a block diagram illustrating an embodiment of a pulse generator configured to generate the floating enable pulse FLOAT_ENP.

The pulse generator delays an active pulse ACTP by a predetermined time to generate a floating enable pulse FLOAT_ENP. Here, the active pulse ACTP is activated when the active command is generated. The pulse generator may include an SR latch 602 and 603, a delay unit 604 and a pulse generation unit 605 to 609. The SR latch 602 and 603 receives the active pulse ACTP, and a delay unit 604 delays the output of the SR latch 602 and 603. The pulse generation unit 605 to 609 receives the output of the delay unit 604 to generate the floating enable pulse FLOAT_ENP, which are fedback to the SR latch 602 and 603.

The pulse generator generates the floating enable pulse FLOAT_ENP after a predetermined delay time from the generation of the active pulse ACTP. The predetermined delay time corresponds to a time taken during a section B of FIG. 8, which will be more fully described later with reference to FIG. 8.

Figure 6B:
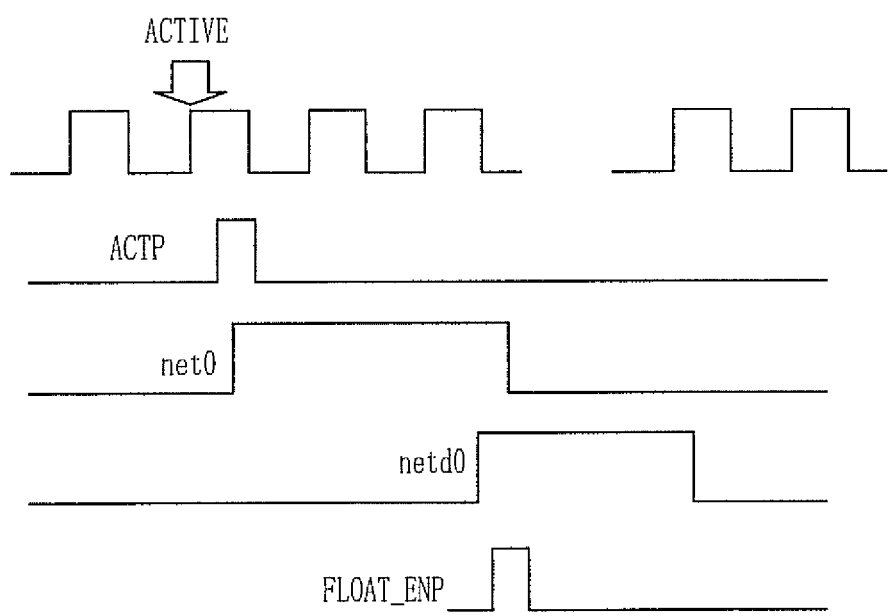
FIG. 6B is a timing diagram illustrating an operation of the pulse generator described in FIG. 6A.

The operation of the pulse generator is appreciably illustrated in a timing diagram of FIG. 6B, and hence further description will be omitted herein.

Figure 7:
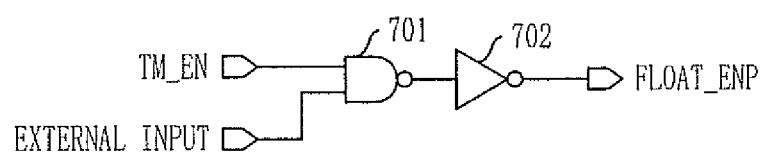
FIG. 7 is a schematic circuit diagram illustrating another embodiment of the pulse generator described in FIG. 6A.

FIG. 7 is a schematic circuit diagram illustrating another embodiment of the pulse generator described in FIG. 6A.

Referring to FIG. 7, the pulse generator generates the floating enable pulse FLOAT_ENP in combination of the test mode enable signal TM_EN and an external input signal EXTERNAL INPUT. The external input signal EXTERNAL INPUT may be an output of a specific combination of external input signals or an input of a specific pin. For instance, an MRS command signal or a BST command signal may be used. Alternatively, a trigger signal may be directly inputted via a CKE pin or the like. Here, the external input signal EXTERNAL INPUT may be controlled such that it maintains its logic low level in a normal state and it is activated to a logic high level at a desired time that the word line starts to float.

Figure 8:
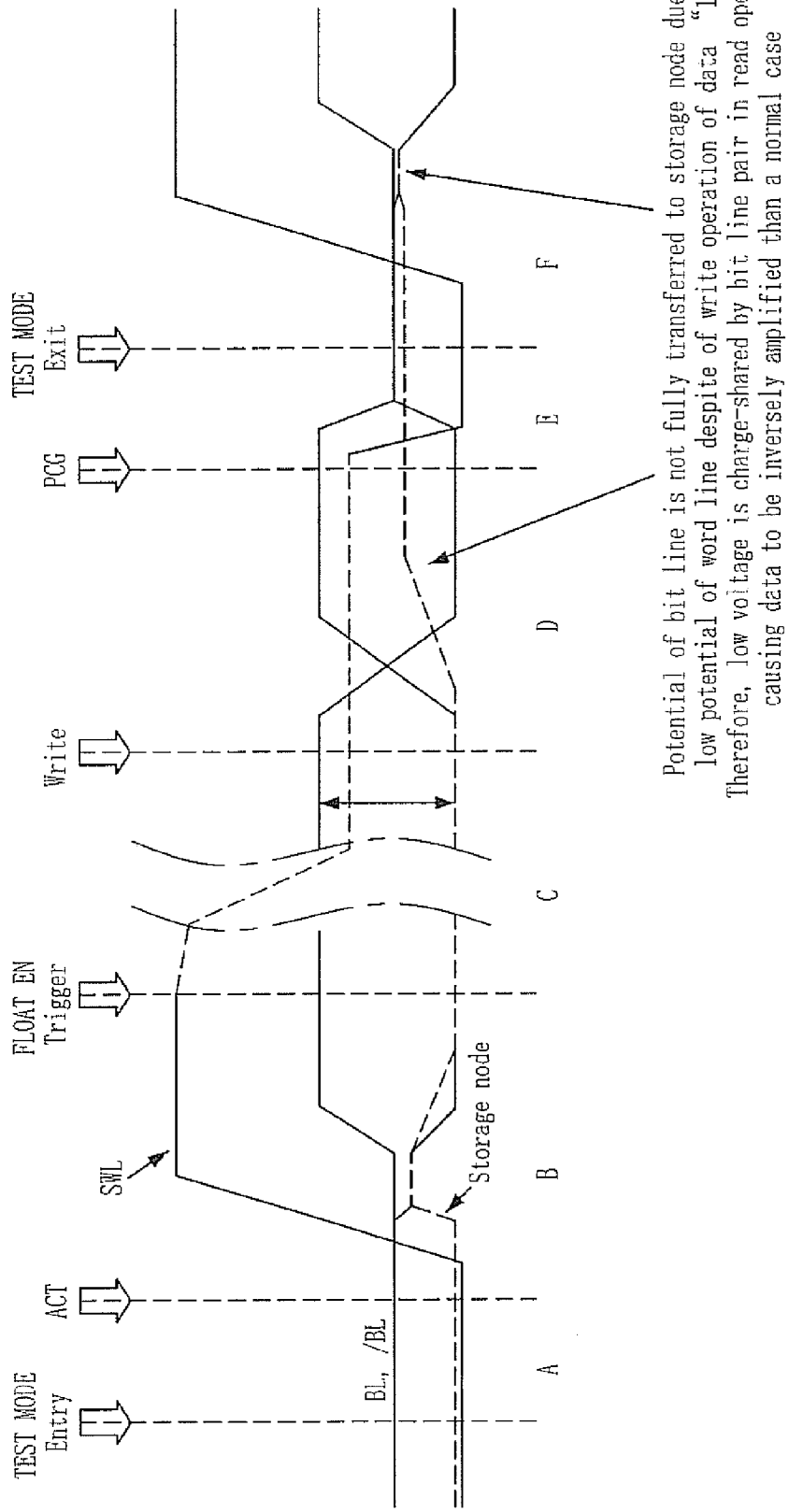
FIG. 8 is a waveform diagram illustrating a method for testing word lines of a semiconductor memory device in accordance with an embodiment of the present invention.

FIG. 8 is a waveform diagram illustrating a method for testing word lines of a semiconductor memory device in accordance with an embodiment of the present invention.

The method of testing the word lines of the semiconductor memory device in accordance with the present invention includes: floating the word line SWL in response to the word line floating signal WL_FLOAT (start of section C); writing data to the floated word line SWL (start of section D); and reading the data from the word line SWL (after exit of test mode).

In detail, when the device enters the test mode for checking whether the word line SWL fails or not, the test mode enable signal TM_EN is activated to a logic high level (section A). Afterwards, the active command ACT is generated to enable the word line SWL and then cell data are charge-shared to induce a potential difference between a bit line pair BL and BLB. The potential difference between the bit line pair BL and BLB is amplified and restored (section B: the delay unit of FIG. 6 is provided for securing a time taken from the active command ACT to a triggering of the floating enable pulse, i.e., reference FLOAT EN Trigger of FIG. 8). After the elapse of a predetermined time, the word line floating signal WL_FLOAT is activated, and thus the word line SWL maintains the floating state until the precharge command PCG is generated (sections C and D).

If there is a physical defect in the word line SWL under the above circumstances, that is, there is a weakly short fail with deactivated word lines or amplified bit lines, a potential level of the word line SWL is transited to that of shorted word lines or bit lines. In the case where a write operation is performed at this state (particularly, 'HIGH' data at which a storage node of a memory cell becomes to have high potential is effective), the write operation of data cannot be perfectly performed because a voltage level of the word line is unstable due to a short fail or the like in the word line SWL. On the contrary, if there is no physical defect in the floated word line SWL, the write operation of data can be normally performed because the voltage level of the word line SWL is not unstable.

As such, when the precharge command PCG is applied after the write operation, the signals for the word line SWL and the bit lines BL and BLB return to their initial states. Thereafter, after exiting the test mode, a read operation of the cell data is normally performed to confirm whether the data is properly written or not. On the basis of this, it is possible to detect whether the word line fails or not.

In summary, the write operation is performed on the memory cell in a state that the word line SWL is made to float in the test mode, and then the read operation is performed to check TRUE/FALSE of the data, thus determining whether the word line SWL fails or not.

Figure 9:
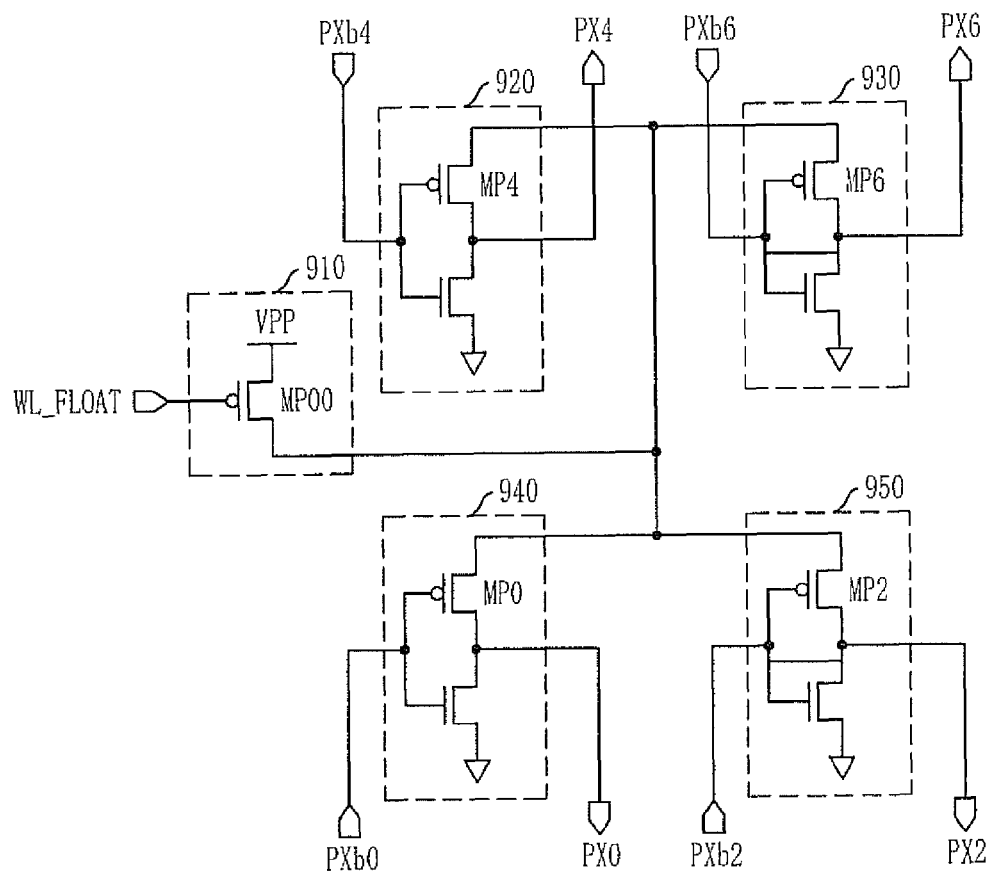
FIG. 9 is a schematic circuit diagram illustrating the case that a plurality of word line drivers share one floating controller.

FIG. 9 is a schematic circuit diagram illustrating the case that a plurality of word line drivers share one floating controller.

Referring to FIG. 9, four phi X drivers 920, 930, 940 and 950 in the adjacent word line drivers may share one floating controller 910. Since FIG. 9 exemplarily illustrates that the plurality of phi X drivers 920, 930, 940 and 950 can share one floating controller 910 but their basic operations are the same as that of FIG. 4, further detailed description will be omitted herein.

Figure 10:
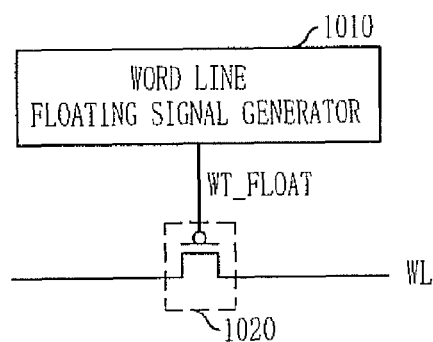
FIG. 10 illustrates a block diagram of a semiconductor memory device in accordance with another embodiment of the present invention.

FIG. 10 illustrates a block diagram of a semiconductor memory device in accordance with another embodiment of the present invention.

Differently from the semiconductor memory device of FIG. 4 in which the word line is made to float through the word line driver, the semiconductor memory device in accordance with another embodiment may be configured such that the word line floating signal WL_FLOAT directly floats the word line WL.

Referring to FIG. 10, the semiconductor memory device in accordance with another embodiment of the present invention may include a word line floating signal generator 1010 and a word line WL (or a sub word line SWL). The word line floating signal generator 1010 generates a word line floating signal WL_FLOAT for floating the word line WL. The word line WL (or the sub word line SWL) floats in response to the word line floating signal WL_FLOAT.

The word line floating signal generator 1010 may generate the word line floating signal WL_FLOAT in response to a signal inputted from the outside (see description of FIG. 7). To this end, new pins may be separately allocated. Furthermore, as illustrated in FIGS. 5 to 7, the word line floating signal generator 1010 may include a pulse generator (see FIGS. 6A and 7) configured to generate the floating enable pulse FLOAT_ENP and the floating signal generator (see FIG. 5A) configured to generate the word Fine floating signal WL_FLOAT.

In the embodiment of FIG. 10, the word line WL is made to directly float without the use of the word line driver. That is, the floating controller 1020 for floating the word Fine WL is provided on the word line WL. In this case, the floating controller 1020 may include a transistor configured to receive the word line floating signal WL_FLOAT through a gate thereof and enable/disable the word line WL via a drain-source path thereof.

As for its operation, when the word line floating signal WL_FLOAT is disabled to a logic low level, the transistor turns on so that the word line WL normally operates. On the contrary, when the word line floating signal WL_FLOAT is activated to a logic high level, the transistor turns off, thus floating the word line WL.

As described above, in accordance with the present invention, the floating controller is provided for floating the word line, which makes it possible to float the word line in a test mode. Additionally, it is possible to perform a write operation in a floating state of the word line.

When a read operation is performed to determine TRUE/FALSE of the written data after the write operation, it is advantageous in that it is possible to easily detect whether the word line fails or not.

As the feature size of a semiconductor fabrication shrinks continuously, a problem between interconnections such as word lines becomes more serious. Accordingly, the application of the present invention can contribute to the increase of efficiency in developing a memory device.

While the present invention has been described with respect to the specific embodiments, it will be apparent to a person of ordinary skill in the art that various changes and modifications may be made without departing from the spirit and scope of the invention as defined in the following claims.

What is claimed is:

1. A dynamic random access memory, comprising:
   a word line driver configured to control a word line which is selected by an address to be enabled; and
   a floating controller configured to control the word line driver so that no fixed voltage is applied to the selected word line when a word line floating signal is activated,
   wherein the word line floating signal is activated in a write operation period of a memory cell connected to the selected word line.

2. The dynamic random access memory as recited in claim 1, wherein the word line driver applies a high voltage to the selected word line when the word line floating signal is deactivated.

3. The dynamic random access memory as recited in claim 1, wherein the word line floating signal is activated after the lapse of a predetermined time from a generation of an active command in a test mode, and deactivated by a precharge command.

4. A word line driving circuit of dynamic random access memory, comprising:
   a word line driver configured to drive a word line, which is selected by an address, by supplying a high voltage; and
   a floating controller configured to prevent the word line driver from supplying the high voltage to the selected word line in response to a word line floating signal,
   wherein the word line floating signal is activated in a write operation period of a memory cell connected to the selected word line.

5. The word line driving circuit as recited in claim 4, wherein the word line floating signal is activated after the lapse of a predetermined time from a generation of an active command in a test mode, and deactivated by a precharge command.

6. A method for testing a dynamic random access memory, the method comprising:
   supplying a high voltage to a selected word line which is selected by an address;
   floating the selected word line so that no fixed voltage is applied to the selected word line;
   writing data to a memory cell connected to the selected word line which is floated; and
   reading the data of the memory cell.

7. The method as recited in claim 6, wherein floating of the selected word line is accomplished by preventing the high voltage from being supplied to a word line driver in response to a word line floating signal.

* * * * *

UNITED STATES PATENT AND TRADEMARK OFFICE
CERTIFICATE OF CORRECTION

Page 1 of 1

PATENT NO.       : 8,488,380 B2
APPLICATION NO.  : 13/274722
DATED            : July 16, 2013
INVENTOR(S)      : Chang-Ho Do It is certified that error appears in the above-identified patent and that said Letters Patent is hereby corrected as shown below:

Title Page, change the Assignee section as follows:

(73)     Assignee:     Hynix Semiconductor Inc.,
                       Gyeonggi-do (KR)

Signed and Sealed this
Third Day of September, 2013

Teresa Stanek Rea
*Acting Director of the United States Patent and Trademark Office*